(12) United States Patent
Li et al.

(10) Patent No.: US 10,732,233 B2
(45) Date of Patent: Aug. 4, 2020

(54) CALIBRATION OF SENSITIVITY AND AXIAL ORTHOGONALITY FOR MAGNETOMETERS

(71) Applicant: Halliburton Energy Services, Inc., Houston, TX (US)

(72) Inventors: Wenquan Li, Kingwood, TX (US); Randal Thomas Beste, Katy, TX (US); Jesse Kevin Hensarling, Cleveland, TX (US); Brian Roberson, The Woodlands, TX (US); John Harrison Farrah, Houston, TX (US); Tony Vu, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 108 days.

(21) Appl. No.: 15/953,661

(22) Filed: Apr. 16, 2018

(65) Prior Publication Data

US 2018/0231619 A1 Aug. 16, 2018

Related U.S. Application Data

(63) Continuation of application No. 14/716,208, filed on May 19, 2015, now abandoned.
(Continued)

(51) Int. Cl.
*G01R 33/00* (2006.01)
*G01V 13/00* (2006.01)
*G01V 3/08* (2006.01)

(52) U.S. Cl.
CPC ......... *G01R 33/0035* (2013.01); *G01V 3/081* (2013.01); *G01V 13/00* (2013.01)

(58) Field of Classification Search
CPC ............ G01R 33/0017; G01R 33/0023; G01R 33/0029; G01R 33/0035; G01R 33/02;
(Continued)

(56) References Cited

U.S. PATENT DOCUMENTS 3,389,333 A * 6/1968 Wolff .................. G01R 33/025
361/146
5,032,792 A 7/1991 Wing
(Continued)

FOREIGN PATENT DOCUMENTS

CN 201017506 Y 2/2008
WO WO 2016022192 2/2016

OTHER PUBLICATIONS

"Importance of Industrial Grade Sensor Calibration", Vector Nav Technologies, LLC., Retrieved from the Internet http://web.archive.org/web/20140806194443/http://www.vectornav.com/support/library/calibration, 2014.
(Continued)

*Primary Examiner* — David M Schindler
(74) *Attorney, Agent, or Firm* — Haynes and Boone, LLP

(57) ABSTRACT

A reduced-cost apparatus for calibrating the sensitivity and orthogonality of a triaxial magnetometer, and a method for adjusting the distance between the two coils of a Helmholtz coil and other related parameters are described herein. A method can include positioning a calibrated magnetometer within a mounting fixture between two coils of a Helmholtz coil, the two coils arranged in mutually parallel planes and separated by the radius of the Helmholtz coil, the mounting fixture mounted such that a position of the mounting fixture is adjustable along an axis orthogonal to the mutually parallel planes; adjusting the position of the mounting fixture over at least some of the positions and measuring the magnetic field at each position to generate a set of magnetic field measurements associated with the positions; and adjusting the first distance based on the first set of magnetic field measurements. Additional apparatuses, systems, and methods are disclosed.

7 Claims, 12 Drawing Sheets

Related U.S. Application Data

(60) Provisional application No. 62/034,999, filed on Aug. 8, 2014.

(58) Field of Classification Search
CPC .............. G01R 33/0206; G01R 33/022; G01R 33/025; G01R 33/04; G01R 33/045; G01R 33/05; G01R 33/06; G01R 33/07; G01R 33/072; G01R 33/075; G01R 33/077; G01R 33/09; G01R 33/093; G01R 33/095; G01R 33/096; G01R 33/098; G01V 13/00; G01V 3/08; G01V 3/081; G01V 3/165; G01V 3/18; G01V 3/26; G01V 3/30
See application file for complete search history.

(56) References Cited

U.S. PATENT DOCUMENTS

| | | | |
|---|---|---|---|
| 5,126,669 A | | 6/1992 | Honess |
| 5,519,318 A | * | 5/1996 | Koerner ................ G01C 17/30 324/247 |
| 5,818,222 A | * | 10/1998 | Ramsden ........... H03K 17/9517 324/202 |
| 9,335,383 B2 | | 5/2016 | Fukasawa |
| 2007/0124097 A1 | | 5/2007 | Geck et al. |
| 2008/0183075 A1 | | 7/2008 | Govari et al. |
| 2008/0281184 A1 | | 11/2008 | White et al. |
| 2009/0273339 A1 | | 11/2009 | Branson |
| 2012/0210562 A1 | | 8/2012 | Jones et al. |

OTHER PUBLICATIONS

Beravs, et al., "Magnetometer Calibration Using Kalman Filter Covariance Matrix for Online Estimation of Magnetic Field Orientation", IEEE Transactions on Instructionation and Measurement, vol. 63, No. 8, Aug. 2014.

Bronaugh, "Helmoholtz Coils for Calibration of Probes and Sensors: Limits of Magnetic Field Accuracy and Uniformity", IEEE International Symposium on Electromagnetic Compatibility, Symposium Record, 1995.

International Application Serial No. PCT/US2015/031562, International Search Report and Written Opinion, dated Aug. 27, 2015.

\* cited by examiner

CALIBRATION OF SENSITIVITY AND AXIAL ORTHOGONALITY FOR MAGNETOMETERS

CROSS-REFERENCE TO RELATED APPLICATIONS

This application is a continuation application of U.S. patent application Ser. No. 14/716,208 filed on May 19, 2015, which claims the benefit of U.S. Provisional Application Ser. No. 62/034,999, filed on Aug. 8, 2014 which applications are incorporated by reference herein in their entirety.

BACKGROUND

Understanding the structure and properties of geological formations can reduce the cost of drilling wells for oil and gas exploration. Measurements made in a borehole (i.e., downhole measurements) are typically performed to attain this understanding, to identify the composition and distribution of material that surrounds the measurement device downhole. To obtain such measurements, magnetometers are sometimes applied to provide telemetry, ranging, and bit location functions.

Currently-available systems for calibrating magnetometers often include three-dimensional Helmholtz coils. However, such systems are often quite expensive. Accordingly, ongoing efforts are directed at reducing costs of magnetometer calibration systems while still maintaining quality, accuracy and sensitivity. Ongoing efforts are further directed at reducing errors that can be generated by Helmholtz coil-based systems.

DETAILED DESCRIPTION

To address some of the challenges described above, as well as others, apparatuses, systems, and methods for accurate and cost-effective sensitivity and axial orthogonality calibration of a triaxial magnetometer are described herein.

Currently-available systems that perform calibration of sensitivity and axial orthogonality for a triaxial magnetometer often include a complex, closed-loop three-dimensional (3D) Helmholtz coil. However, the cost of such systems and related maintenance is typically high. Furthermore, Helmholtz coil-based systems can be affected by various errors, including for example spacing errors between the coils of the Helmholtz coil.

Example embodiments provide a robust, low-cost, reduced-complexity apparatus that uses a one-dimensional (1D) open-loop Helmholtz coil, while maintaining calibration accuracy by providing error control and error mitigation techniques. Apparatuses and systems as described herein with respect to various embodiments can operate in standard laboratory environments without the use of electromagnetic shielding, by executing narrow-bandwidth signal processing techniques such as spectrum estimation and the lock-in amplification, rather than using more complex and costly algorithms such as the Kalman filter.

Ongoing efforts have been directed to identifying and reducing errors caused by a Helmholtz coil-based platform. One error is related to the mechanical separation between the two coils of the Helmholtz coil. For a high precision Helmholtz coil, the mechanical separation distance between the two coils is based on the radius of the Helmholtz coil. Theoretically, the radius of the Helmholtz coil is based on the assumption that the winding on the Helmholtz coil is one turn. However, typical Helmholtz coils often are wound using many turns of wires with several layers. Accordingly, it can be difficult to ascertain the exact mechanical center of the winding and therefore it is not trivial to specify the correct separation distance that should be maintained between the two coils.

Figure 1:
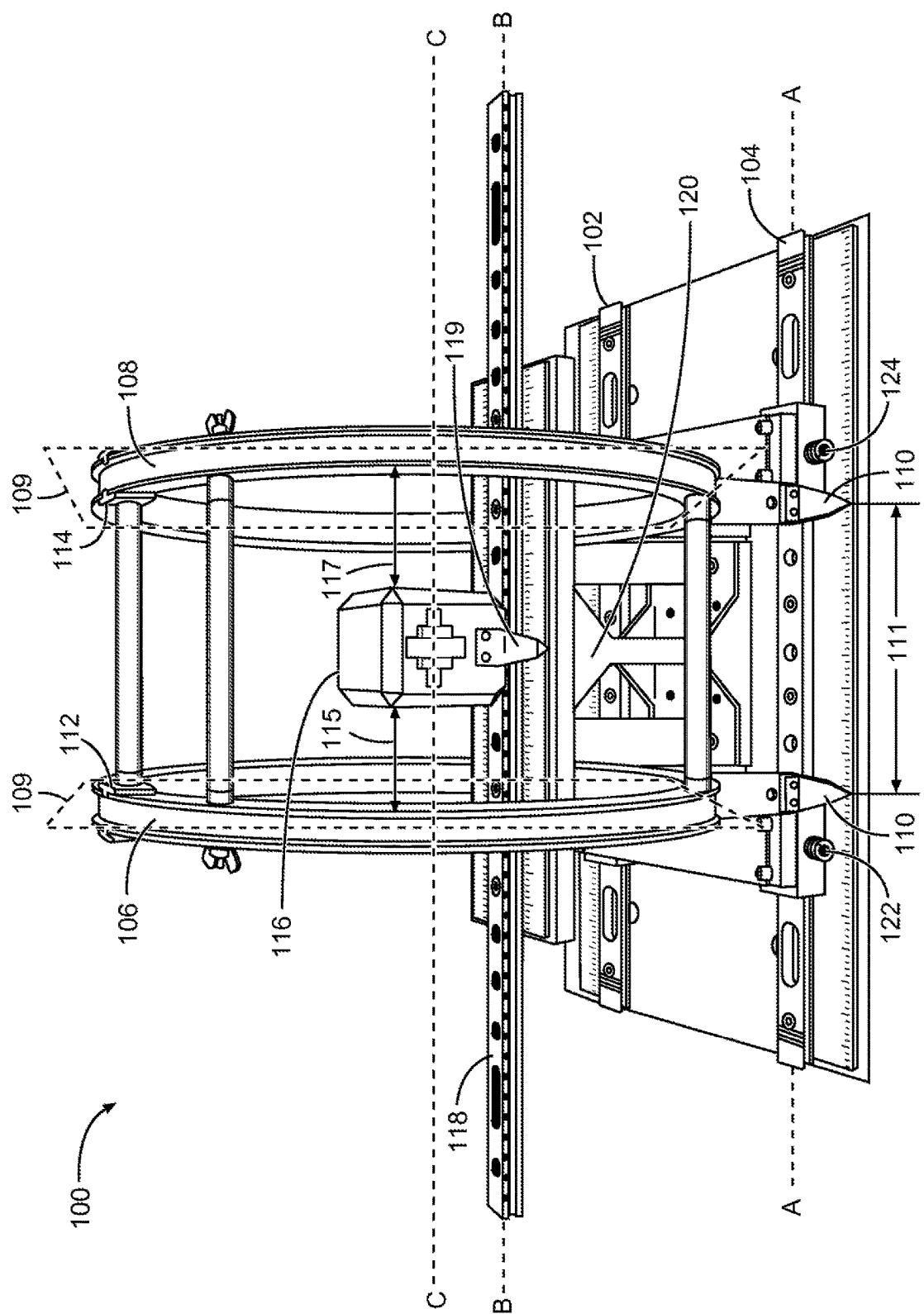
FIG. 1 is a front view of an apparatus including an adjustable mechanical fixture for a one-dimensional (1D) Helmholtz coil in accordance with some embodiments.
Figure 2:
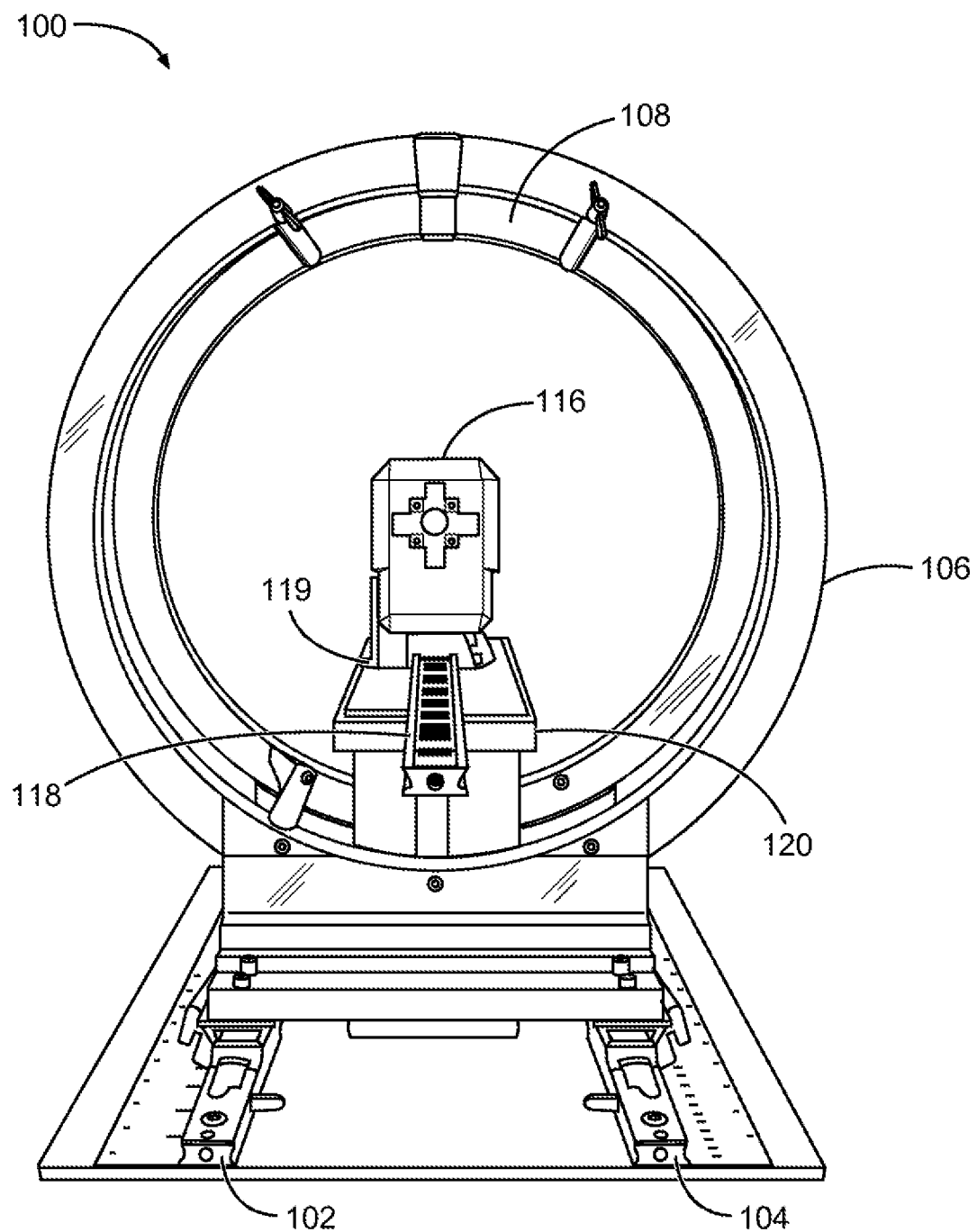
FIG. 2 is a side view of apparatus including an adjustable mechanical fixture for the 1D Helmholtz coil in accordance with some embodiments.

To overcome this difficulty, some embodiments provide an adjustable mechanical fixture for a 1D Helmholtz coil. FIG. 1 is a front view, and FIG. 2 is a side view, of an apparatus 100 including an adjustable mechanical fixture for a 1D Helmholtz coil in accordance with some embodiments.

With reference to FIG. 1, the apparatus 100 includes a pair of rails 102 and 104 with which the two coils 106 and 108 of the 1D Helmholtz coil are slidably engaged. The first coil 106 and the second coil 108 are arranged in mutually parallel planes 109 and spaced a distance 111 apart from each other along an axis A. The rails 102 and 104 are substantially parallel and arranged in a plane substantially orthogonal to the mutually parallel planes 109 of the first coil 106 and the second coil 108. The two coils 106, 108 can move along the first rail and the second rail to adjust a distance between the two coils 106, 108. The apparatus 100 includes location indicators 110 that indicate the mechanical distance 111 between the frames 112, 114 of the two coils 106, 108.

A mounting fixture 116 is placed on a rail 118 at a distance 115, 117 between the two coils 106, 108 of the 1D Helmholtz coil, and the mounting fixture 116 is configured to hold a magnetometer (not shown in FIG. 1), for example a previously-calibrated magnetometer, a non-calibrated triaxial magnetometer, etc., for further calibration as described later herein. A location indicator 119 indicates the mechanical position of the mounting fixture 116 on the rail 118. The rail 118 is mounted on a platform 120. Locking screws 122, 124 lock the coils 106, 108 in place. Each of the rails 102, 104 and 118 can include markings that indicate distance, length, etc. The rail 118 will be arranged along an axis B substantially parallel to axis A.

Figure 3B:
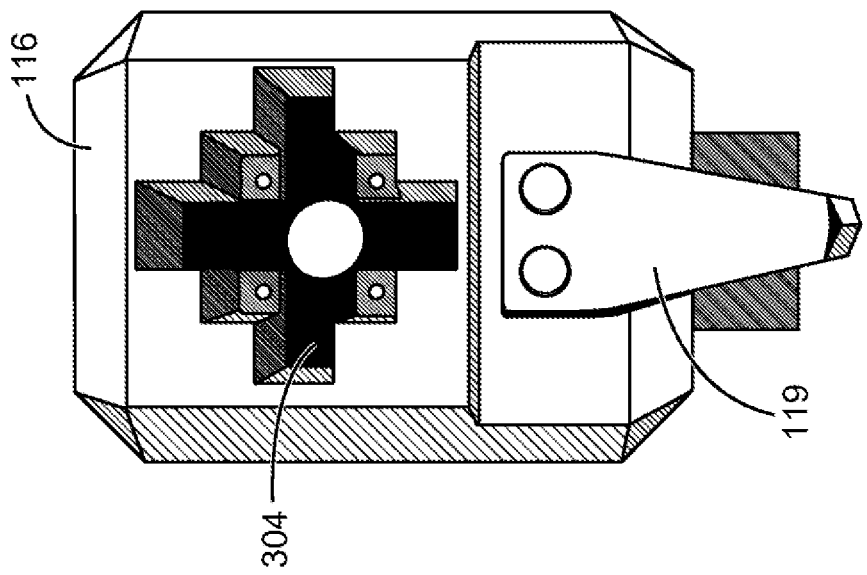
FIGS. 3A and 3B are a front view and a side view, respectively, of a mounting fixture for a magnetometer in accordance with some embodiments.
Figure 3A:
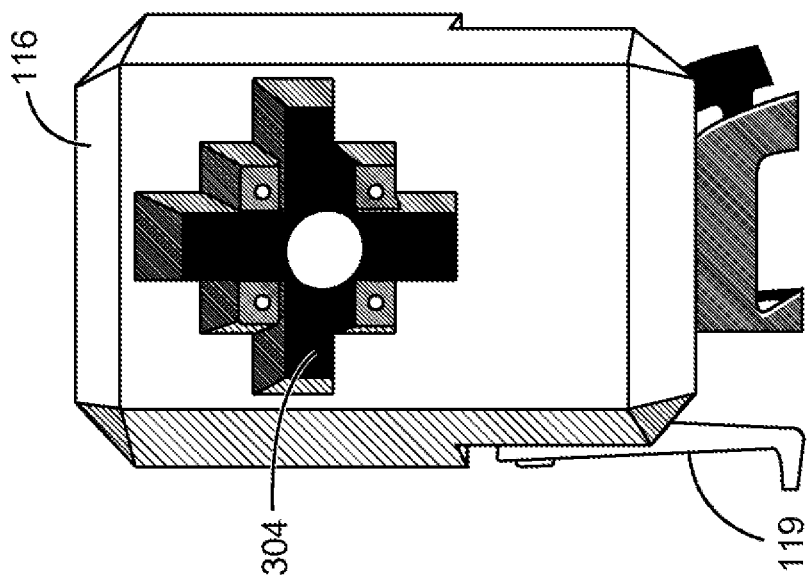

FIGS. 3A and 3B are a front view and a side view, respectively, of a mounting fixture 116 for a magnetometer in accordance with some embodiments. With reference to FIG. 3A, the mounting fixture 116 includes a location indicator 119 for the mounting fixture 116. The mounting fixture 116 further includes an aperture 304 into which the previously-calibrated magnetometer, or a magnetometer that is to be calibrated, is inserted. The aperture 304 is shaped such that a magnetometer inserted into the aperture 304 is rotationally adjustable to rotate about an origin of the mounting fixture 116 to position axes of the magnetometer in at least three orientations, as will be described in more detail below with respect to FIGS. 8A-8C.

Figure 4:
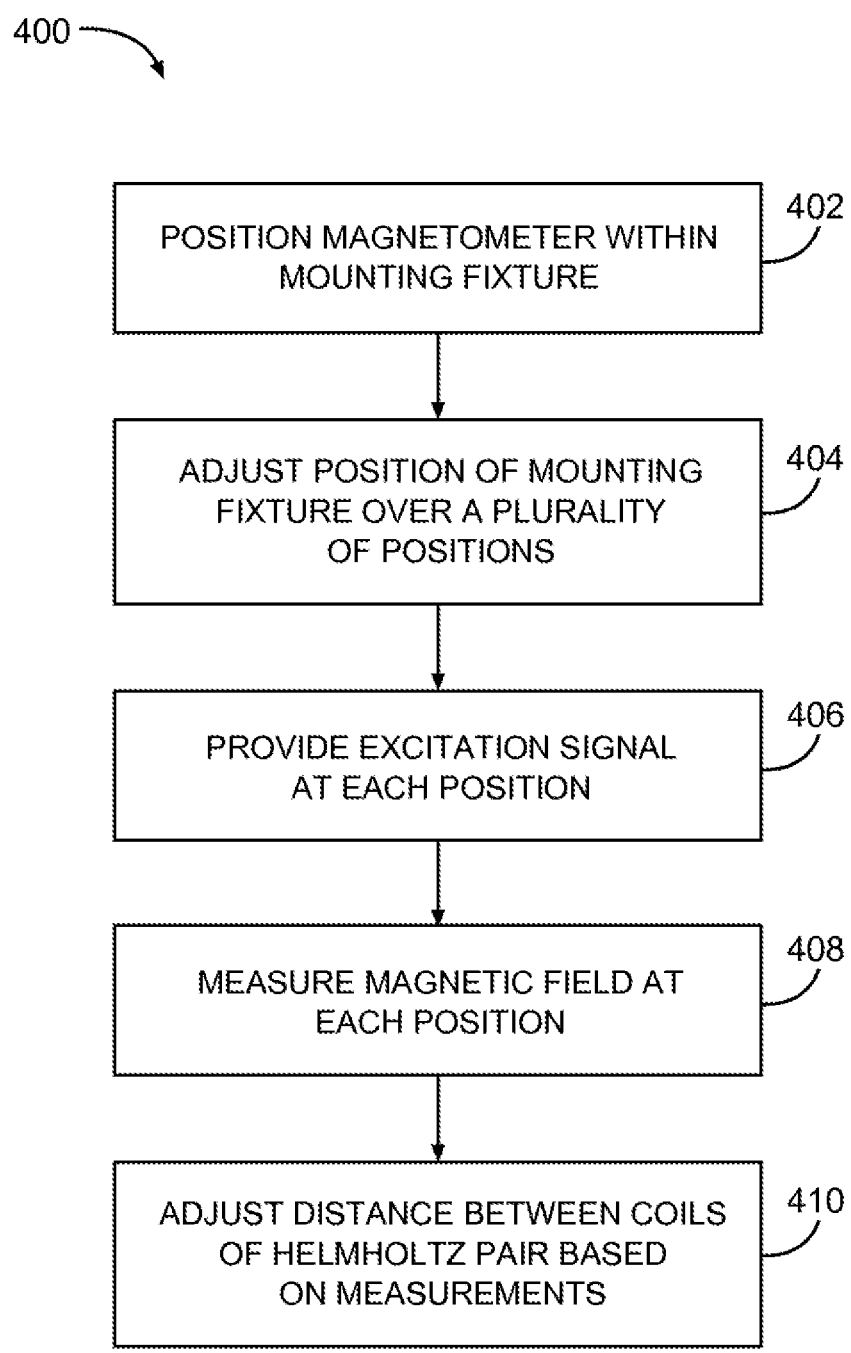
FIG. 4 is a flowchart of an example method for adjusting spacings and distances in a 1D Helmholtz coil in accordance with some embodiments.

FIG. 4 is a flowchart of an example method 400 for adjusting spacings and distances in a 1D Helmholtz coil in accordance with some embodiments. Some operations of the example method 400 can be performed through processor-implemented algorithms using a computing system 918 (FIG. 9), processing units 1120 (FIG. 11), control circuitry, or other components, for example a signal generator 912 (FIG. 9) described later herein. The example method 400 is described with respect to elements depicted in FIGS. 1-3.

The example method 400 begins with operation 402, wherein a previously-calibrated magnetometer (not shown in FIG. 1) is positioned or inserted within the mounting fixture 116 between two coils 106, 108 of the Helmholtz coil. The two coils 106, 108 are initially separated by a first distance, which is based the estimated radius of the Helmholtz coil. The position of the calibrated magnetometer is adjustable between the two coils 106, 108 of the Helmholtz coil by virtue of the calibrated magnetometer being inserted into the mounting fixture 116, which is on rail 118 over several positions along a center axis B between the two coils 106, 108.

An initial, estimated value for the radius of the 1D Helmholtz coil can be decided by first measuring the thickness of the coil windings (not shown in FIG. 1) on the frame 112, 114 of the coil 106, 108, and then adding half of this measured thickness to the measured radius of the coil frame. The location indicators 110 can be set, as an initial matter, one radius-length away from each other.

To estimate the error between the actual and estimated values for the radius of the 1D Helmholtz coil, and the actual and initial separation distance between the two coils of the 1D Helmholtz coil, the apparatus, system, and methods according to various embodiments facilitate calculation of the actual radius of the Helmholtz coil and the separation distance between the two coils 106, 108 through a data fitting according to the following Helmholtz coil mathematical relationship:

$$B(x, s) = \frac{\mu_0 I N R^2}{2}\left[(R^2 + x^2)^{-\frac{3}{2}} + \lceil R^2 + (s-x)^2 \rceil^{-\frac{3}{2}}\right] \quad (1)$$

where B(x, s) is magnetic field generated by the Helmholtz coil at point x when the separation distance between the two coils is s, R the radius of the Helmholtz coil, I is the electrical current flowing in the coil, N the number of the turns on the Helmholtz coil, and $\mu_0$ the permeability of free space.

The example method 400 continues with operation 404, wherein the position of the mounting fixture 116 is adjusted between the two coils 106, 108 over a plurality of positions. For example, the position of the mounting fixture 116 can be adjusted over all or a subset of several possible positions along axis B between the two coils 106, 108. By moving the mounting fixture 116 on rail 118, the operator can move the magnetometer, from left to right and incrementally, through the holder along rail 118. Each incremental step can have a length of about 0.5 inches, though embodiments are not limited thereto.

Figure 9:
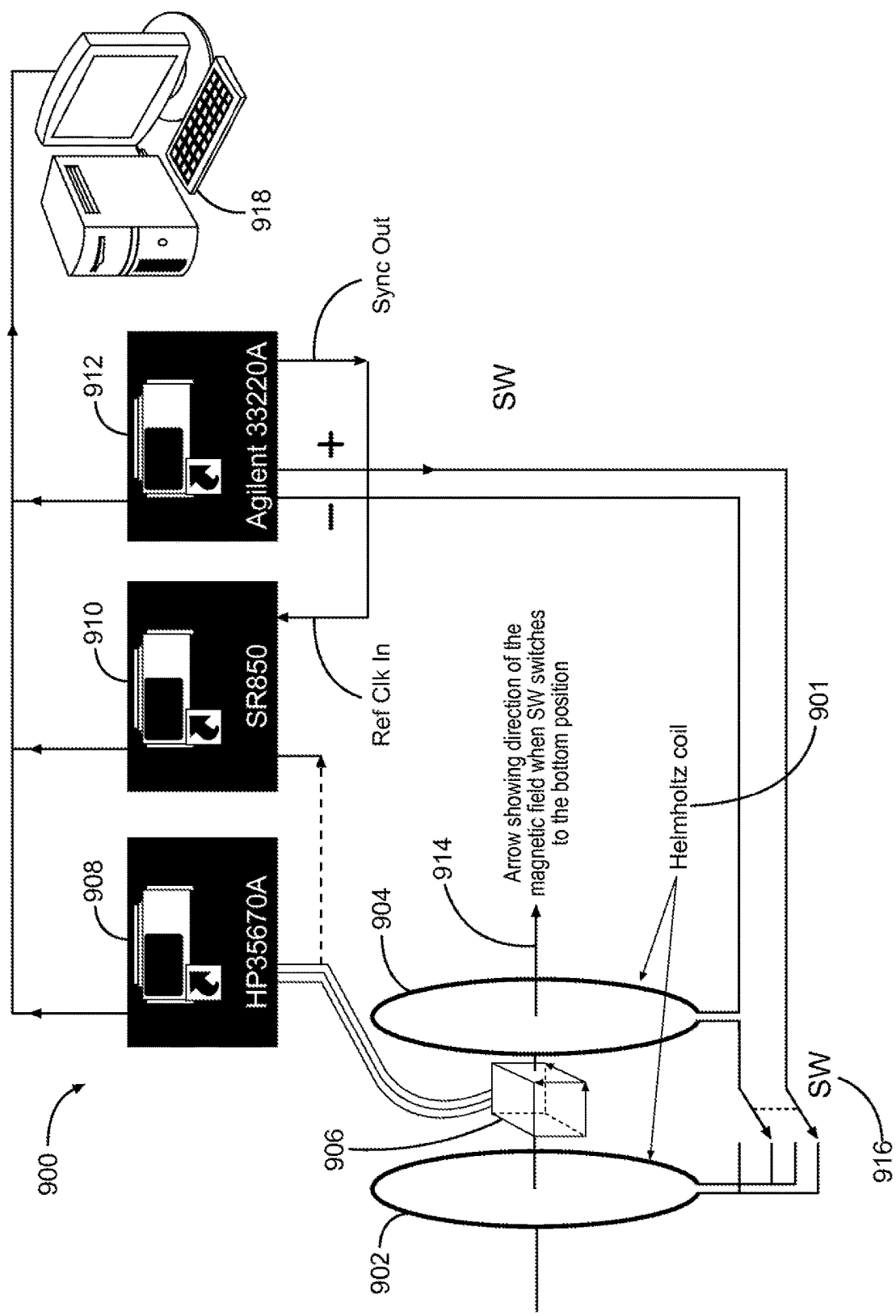
FIG. 9 illustrates a system for calibrating sensitivity and orthogonality of a magnetometer in accordance with some embodiments.

The example method 400 continues with operation 406, wherein a signal generator provides an excitation signal (e.g., a driving signal) to the Helmholtz coil to generate a magnetic field. The excitation signal will be provided at subsequent to adjusting the mounting fixture 116 at each of the incremental steps. The excitation signal may be provided by, for example, the signal generator 912 (FIG. 9). The example method 400 continues with operation 408, wherein the calibrated magnetometer measures the magnetic field at each incremental step to generate a set (e.g., a first set) of magnetic field measurements associated with each of the incremental steps and corresponding positions, for the data fitting into Equation (1). These measurements can be provided to a computing system 918 (FIG. 9) or other circuitry to calculate the actual R and s according to Equation (1). The computing system 918 can generate a best fit curve or perform other processing based on the measurements, and the computing system 918 can determine the calculated value for R and s or any other parameter or value based on the best fit curve.

If the calculated s is different from the distance set by the location indicators 110, the operator will adjust distance between the two coils 106, 108 in operation 408, by sliding one coil along rails 102, 104 to make the actual separation of the two coils 106, 108 equal to the true, calculated radius of the Helmholtz coil. In some embodiments, operators can repeat one or more operations of the example method 400, through two or more iterations of the example method 400, so that the actual separation distance between the two coils will be equal to the actual radius of the Helmholtz coil.

A second error associated with Helmholtz coil-based systems in the error associated with the actual center location of the Helmholtz coil. This center location is the position at which a to-be-calibrated magnetometer should be placed, in order to perform calibration of that magnetometer using the Helmholtz coil.

With the two coils having been separated with the true radius of the Helmholtz coil by the above example method 400, based on Equation (1), operators can calibrate the position for the mounting fixture 116 between the two coils 106, 108. To calibrate the position, operators will adjust the position of the mounting fixture 116 through a plurality of positions similar to the procedure described above with respect to example method 400 to move the previously-calibrated magnetometer along the rail 118 between the two coils 106, 108. The signal generator can provide excitation signals to generate magnetic fields, similar to the procedure described above. The previously-calibrated magnetometer can measure the magnetic field at each of a plurality of positions to generate a second set of magnetic field measurements associated with the plurality of positions. The measured magnetic field data is used by a computing system 918 (FIG. 9), for example, or by other control or measurement circuitry to calculate the center location of the Helmholtz coil with respect to the origin of the coordinates of the Helmholtz coil, by means of data fitting into Equation (2) to find the offset $x_0$.

$$B(x, s) = \frac{\mu_0 INR^2}{2}\left[[R^2 + (x_0 + k\Delta x)^2]^{\frac{-3}{2}} + [R^2 + [R - (x_0 + k\Delta x)]^2]^{\frac{-3}{2}}\right] \quad (2)$$

where, $x_0$ the offset of a first coil 106 from the center point between the two coils 106, 108 of the Helmholtz-coil, where the location of the first coil 106 is used as the origin of the Helmholtz-coil coordinates; $\Delta x$ the step length (e.g., 0.5 inch), k is an integer (e.g., k=0, 1, 2 . . . , 15) that reflects the index of the current step at which the magnetic field is being measured. "First coil" in this context refers to the nearest coil to the magnetometer at k=0. As described with respect to Equation (1), B(x, s) is the magnetic field generated by the Helmholtz coil at point x when the separation distance between the two coils is s, R the radius of the Helmholtz coil, I is the electric current flowing in the coil, N the number of the turns on the Helmholtz coil, and $\mu_0$ the permeability of free space.

Operators can then adjust the position of the mounting fixture 116 according to a center location of the Helmholtz coil, the center location having been calculated based on Equation (2). The offset $x_0$ will be a negative number because the first coil 106 is used as the origin of the Helmholtz coil. If the absolute value $|x_0|$ of the calculated $x_0$ is equal to R/2, then the magnetometer should be placed between the two coils 106, 108 at the point that is $|x_0|$ away from the location of the first coil 106. The location of the first coil is indicated by the location indicator 110 on the frame 112 of the first coil. If $|x_0|$ is larger than R/2, the magnetometer should be placed between the two coils at the point that is $|x_0|+(x_0+R/2)$ away from the location indicated by the location indicator 110 on the frame of the first coil 106.

A third error associated with Helmholtz coil-based systems is that of the limited space at the center of the Helmholtz coil where the magnetic field generated by the Helmholtz coil is uniform. This error can have a particularly deleterious effect on the accuracy of the orthogonality calibration.

Figure 5:
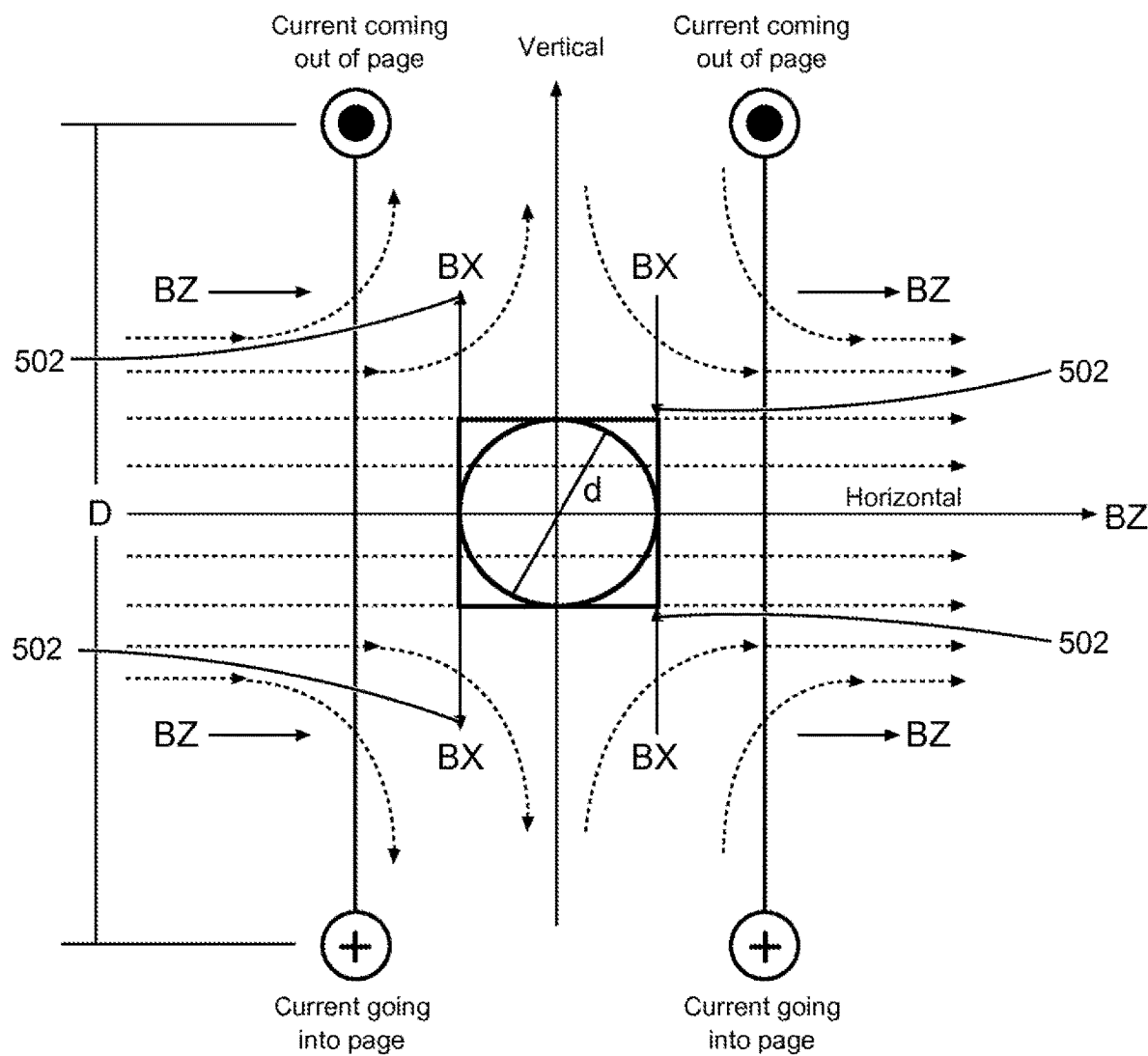
FIG. 5 illustrates components of a magnetic field inside a 1D Helmholtz coil in accordance with some embodiments.

FIG. 5 illustrates components of a magnetic field inside a Helmholtz coil in accordance with some embodiments. With reference to FIG. 5, the vertical component BX of the magnetic field can become significant at the edges of the measurement space delimited by the four arrows 502 of FIG. 5, if the ratio of D to d is not sufficiently large, where D is the diameter of the Helmholtz coil, and d is the maximum dimension of the to-be-calibrated magnetometer. This can cause the magnetic field in the region of calibration to be less uniform, leading to errors in measurement. However, embodiments control the amplitude of the vertical components within 0.016% of the amplitude of the horizontal by configuring the diameters such that D≥8d.

A fourth error associated with Helmholtz coil-based systems is that of machining the Helmholtz coil frame. Embodiments reduce or eliminate this error through use of stricter mechanical tolerance specifications for the machine work and by installing the locking screws 122, 124 (FIG. 1) between the frames 112, 114 of the two coils 106, 108, to reduce or eliminate variations in the shape or dimension of the Helmholtz coil with temperature and mechanical vibration.

A fifth error associated with Helmholtz coil-based systems is that of uniformity of the wire windings on the Helmholtz coil. Embodiments reduce or eliminate this error by winding the coil one layer after another as uniformly as possible with each layer being taped by a strong insulation tape of high temperature, so that movement of the windings of every layer is reduced or eliminated during temperature variation and mechanical vibration.

A sixth error associated with Helmholtz coil-based systems is the mechanical error of the fixture that holds the magnetometer to the center of the Helmholtz coil, which can also cause the error of misalignment. Embodiments reduce or eliminate this error by using 3-D printing of the supporting platform 120 and the mounting fixture 116 that holds the triaxial magnetometer in the precise orientation with respect to the central axis C of the Helmholtz coil.

A seventh error associated with Helmholtz coil-based systems is caused by the electromagnetic interference of the environment. The 1D Helmholtz coil can be combined in some embodiments to form a system that includes a lock-in amplifier for checking the center of the to-be-calibrated magnetometer as will be described later herein. A system according to some embodiments can also include a spectrum analyzer for Fast Fourier Transform (FFT) analysis of signals received from a to-be-calibrated magnetometer, to reduce or eliminate electromagnetic interference as can be generated in some testing environments. A system in accordance with some embodiments will also include a function/arbitrary waveform generator for driving the Helmholtz coil to generate a sinusoidal magnetic field, which can then be measured according to methods described later herein to determine sensitivity, misalignment errors, and other parameters or error sources associated with a magnetometer.

Figure 6:
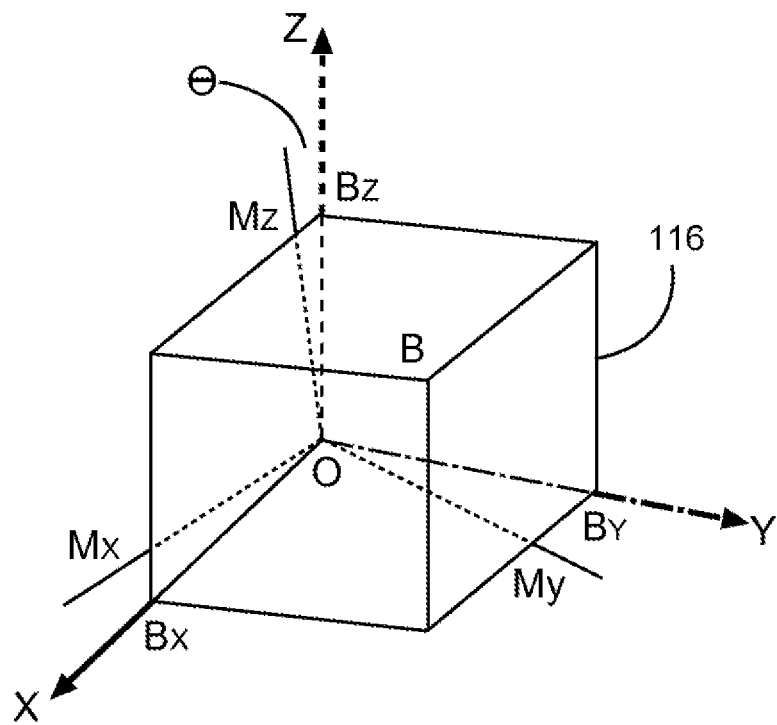
FIG. 6 illustrates coordinates of axes of a magnetometer relative to coordinates of the mounting fixture for purposes of illustrating misalignment errors that can be accounted for in accordance with some embodiments.

FIG. 6 illustrates coordinates of axes of a magnetometer relative to coordinates of the mounting fixture 116 for purposes of illustrating misalignment errors that can be accounted for in accordance with some embodiments. As will be appreciated, a misalignment condition θ may exist with respect to one or more axes wherein at least one of the magnetometer axes is shifted from, and therefore does not align with, coordinates of the mounting fixture 116.

Referring to FIG. 6, ($M_x$, $M_y$, $M_z$) are the coordinates of the three magnetic axes of a triaxial magnetometer, and (x, y, z) are the coordinates of the mounting fixture 116. Further, the origins of these two coordinates are assumed to coincide at O, which is the center of the Helmholtz coil.

Given that B is the applied magnetic field, and the components in the (x,y,z) coordinate system are Bx, By, and Bz:

$$B = \begin{pmatrix} B_x \\ B_y \\ B_z \end{pmatrix} = \begin{pmatrix} 1 \\ 1 \\ 1 \end{pmatrix} \text{gauss} \quad (3)$$

A projection of B to the coordinates (Mx, My, Mz) can be represented by projection matrix B2M:

$$B2M = \begin{pmatrix} BXm_x & BYm_x & BZm_x \\ BXm_y & BYm_y & BZm_y \\ BXm_z & BYm_z & BZm_z \end{pmatrix} \quad (4)$$

where, $BXm_x$, $BXm_y$ and $BXm_z$ are the voltage outputs of X-axis, Y-axis and Z-axis of the magnetometer, respectively, when the applied magnetic field is:

$$B = \begin{pmatrix} Bx \\ By \\ Bz \end{pmatrix} = \begin{pmatrix} 1 \\ 0 \\ 0 \end{pmatrix} \quad (5)$$

$BYm_x$, $BYm_y$ and $BYm_z$ are the voltage outputs of X-axis, Y-axis and Z-axis of the magnetometer, respectively, when the applied magnetic field is:

$$B = \begin{pmatrix} Bx \\ By \\ Bz \end{pmatrix} = \begin{pmatrix} 0 \\ 1 \\ 0 \end{pmatrix} \quad (6)$$

$BZm_x$, $BZm_y$ and $BZm_z$ are the voltage outputs of X-axis, Y-axis and Z-axis of the magnetometer, respectively, when the applied magnetic field is:

$$B = \begin{pmatrix} Bx \\ By \\ Bz \end{pmatrix} = \begin{pmatrix} 0 \\ 0 \\ 1 \end{pmatrix} \quad (7)$$

The Sensitivity and the misalignment error can be calculated by using the elements of the projection matrix B2M as shown by Table 1:

TABLE 1

Sensitivity and misalignment of an example magnetometer relative to an example mounting fixture.

| | Sensitivity (V/gauss) | Misalignment towards X-axis (degrees) | Misalignment towards Y-axis (degrees) | Misalignment towards Z-axis (degrees) |
|---|---|---|---|---|
| X-axis | $\dfrac{BXm_x}{B_x}$ | | $\dfrac{BXm_y}{BXm_x}$ | $\dfrac{BXm_z}{BXm_x}$ |
| Y-axis | $\dfrac{BYm_y}{B_y}$ | $\dfrac{BYm_x}{BYm_y}$ | | $\dfrac{BYm_z}{BYm_y}$ |
| Z-axis | $\dfrac{BZm_z}{B_z}$ | $\dfrac{BYm_x}{BYm_z}$ | $\dfrac{BZm_y}{BXm_z}$ | |

Since projection matrix B2M in Equation (4) includes error information for both sensitivity and misalignment errors, embodiments use B2M to remove these errors through a compensation matrix C:

$$C = B_x \cdot B2M^{-1} = B_x \cdot \begin{pmatrix} BXm_x & BYm_x & BZm_x \\ BXm_y & BYm_y & BZm_y \\ BXm_z & BYm_z & BZm_z \end{pmatrix} \quad (8)$$

If $$\begin{pmatrix} Vx \\ Vy \\ Vz \end{pmatrix}$$

are the voltage outputs of an example magnetometer, then the actual magnetic field $$\begin{pmatrix} Bx \\ By \\ Bz \end{pmatrix}$$

will be:

$$\begin{pmatrix} Bx \\ By \\ Bz \end{pmatrix} = B_x \cdot \begin{pmatrix} BXm_x & BYm_x & BZm_x \\ BXm_y & BYm_y & BZm_y \\ BXm_z & BYm_z & BZm_z \end{pmatrix}^{-1} \cdot \begin{pmatrix} Vx \\ Vy \\ Vz \end{pmatrix} \quad (9)$$

Therefore, if a known magnetic field is applied, and the voltage outputs $$\begin{pmatrix} Vx \\ Vy \\ Vz \end{pmatrix}$$

can be measured, the compensation matrix C can be generated for that magnetometer.

Figure 7:
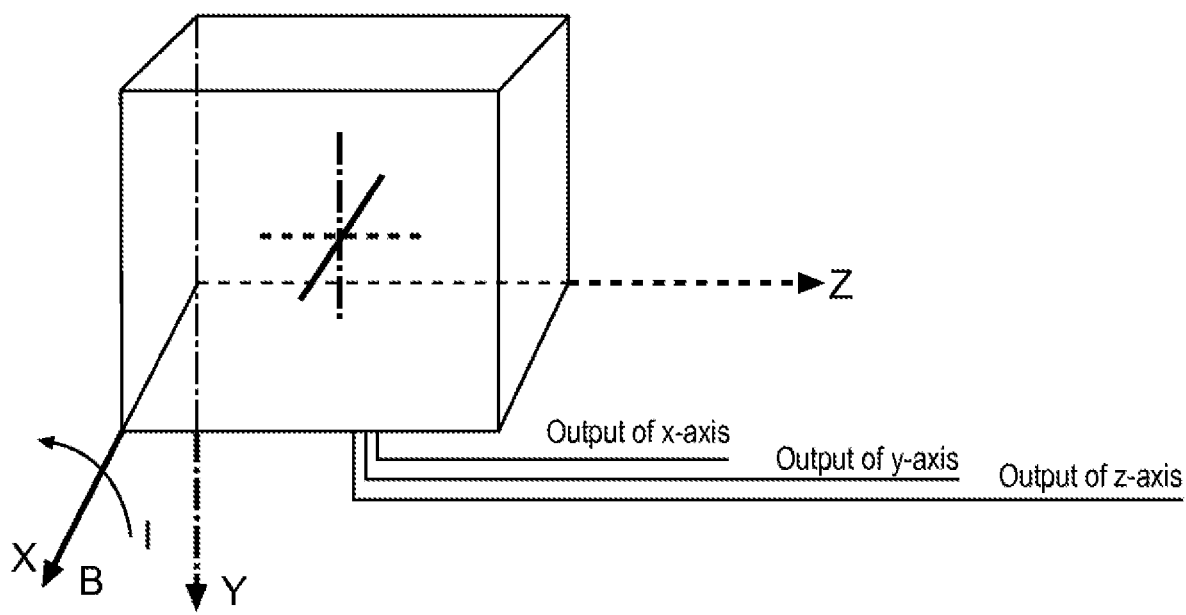
FIG. 7 illustrates orientations of axes of a magnetometer with respect to a magnetic field in accordance with some embodiments.

Orientations of the axes of a magnetometer are defined before a magnetic field is applied to the axes for the measurement of sensitivity and misalignment. FIG. 7 illustrates orientations of axes x, y, and z of a magnetometer with respect to a magnetic field B in accordance with some embodiments. Measurement circuitry or a measurement device, such as a lock-in amplifier and a spectrum analyzer described in more detail below, can couple to one or more of the output of the X-axis, the output of the Y-axis, and the output of the Z-axis to measure the magnetic field seen at each respective axis.

Figure 8C:
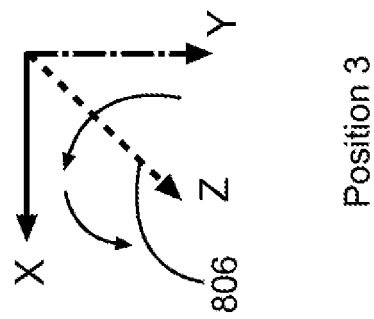
FIGS. 8A-8C illustrate orientations of axes of a magnetometer for use in calibrating the magnetometer in accordance with some embodiments.
Figure 8B:
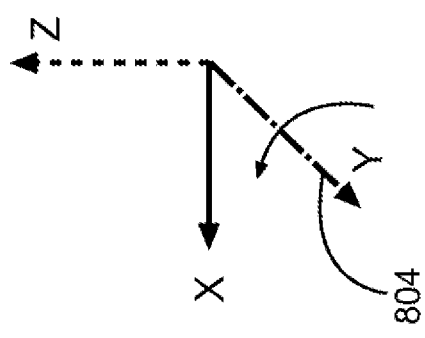
Figure 8A:
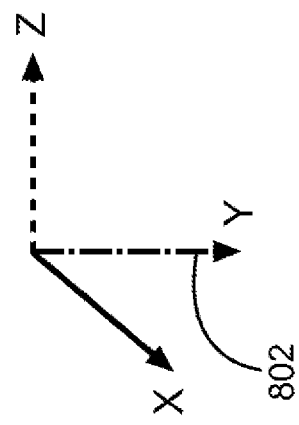

FIGS. 8A-8C illustrate orientations of axes of a magnetometer for use in calibrating the magnetometer in accordance with some embodiments.

Referring to FIG. 8A, the Y-axis of the magnetometer is pointing downward when the magnetic field is applied in the positive direction of the X-axis of a magnetometer as shown by the arrow 802; and the positive direction of the Z-axis of the magnetometer is pointing to the left with reference to the viewpoint of one facing the positive direction of the X-axis of the magnetometer.

Referring to FIG. 8B, the X-axis of the magnetometer is pointing to the left, when the magnetic field is applied in the positive direction of the Y-axis of the magnetometer as shown by the arrow 804; and the positive direction of the Z-axis of the magnetometer is pointing upward.

Referring to FIG. 8C, the X-axis of magnetometer is pointing to the left, when the magnetic field is applied in the positive direction of the Z-axis of the magnetometer as shown by the arrow 806; and the positive direction of the Y-axis of the magnetometer is pointing downward.

Table 2 is example measured raw data for a magnetometer:

TABLE 2 measured raw data of an example magnetometer.

| Orientation | Applied magnetic field (gauss) | X-axis output (mV RMS) | Y-axis output (mV RMS) | Z-axis output (mV RMS) |
|---|---|---|---|---|
| FIG. 8A | .099987 | 709.352 | −3.3448 | 12.521 |
| FIG. 8B | .099987 | −3.983 | 709.994 | 0.503 |
| FIG. 8C | .099987 | 1.63 | −1.906 | 709.036 |

Table 3 is calculated sensitivity and misalignment of an example magnetometer based on information of Table 1:

|  | Measured sensitivity (volt/gauss) | Misalignment towards X-axis (degrees) | Misalignment towards Y-axis (degrees) | Misalignment towards Z-axis (degrees) |
|---|---|---|---|---|
| X-axis | 10.038705 |  | −0.270012 | 1.010671 |
| Y-axis | 10.042128 | −0.321421 |  | 0.040592 |
| Z-axis | 10.028578 | 0.131717 | −0.15402 |  |

Assuming that every axis of the magnetometer being calibrated receives an applied magnetic field of 0.099987 gauss, the voltage output of the magnetometer, according to Table 2, will be:

$$\begin{pmatrix} Vx \\ Vy \\ Vz \end{pmatrix} = \frac{\sqrt{2}}{1000 \times 0.099987} \begin{pmatrix} 709.752 & -3.983 & 1.63 \\ -3.3448 & 709.994 & -1.906 \\ 12.521 & 0.503 & 709.036 \end{pmatrix} \begin{pmatrix} 0.099987 \\ 0.099987 \\ 0.099987 \end{pmatrix}$$

which can be calculated to equal:

$$\begin{pmatrix} 1.004459 \\ 1.006613 \\ 1.016469 \end{pmatrix} \text{volt}$$

To remove sensitivity and misalignment errors, these voltage outputs of the magnetometer are multiplied by a compensation matrix generated as described above regarding Equations (8)-(9).

Figure 10:
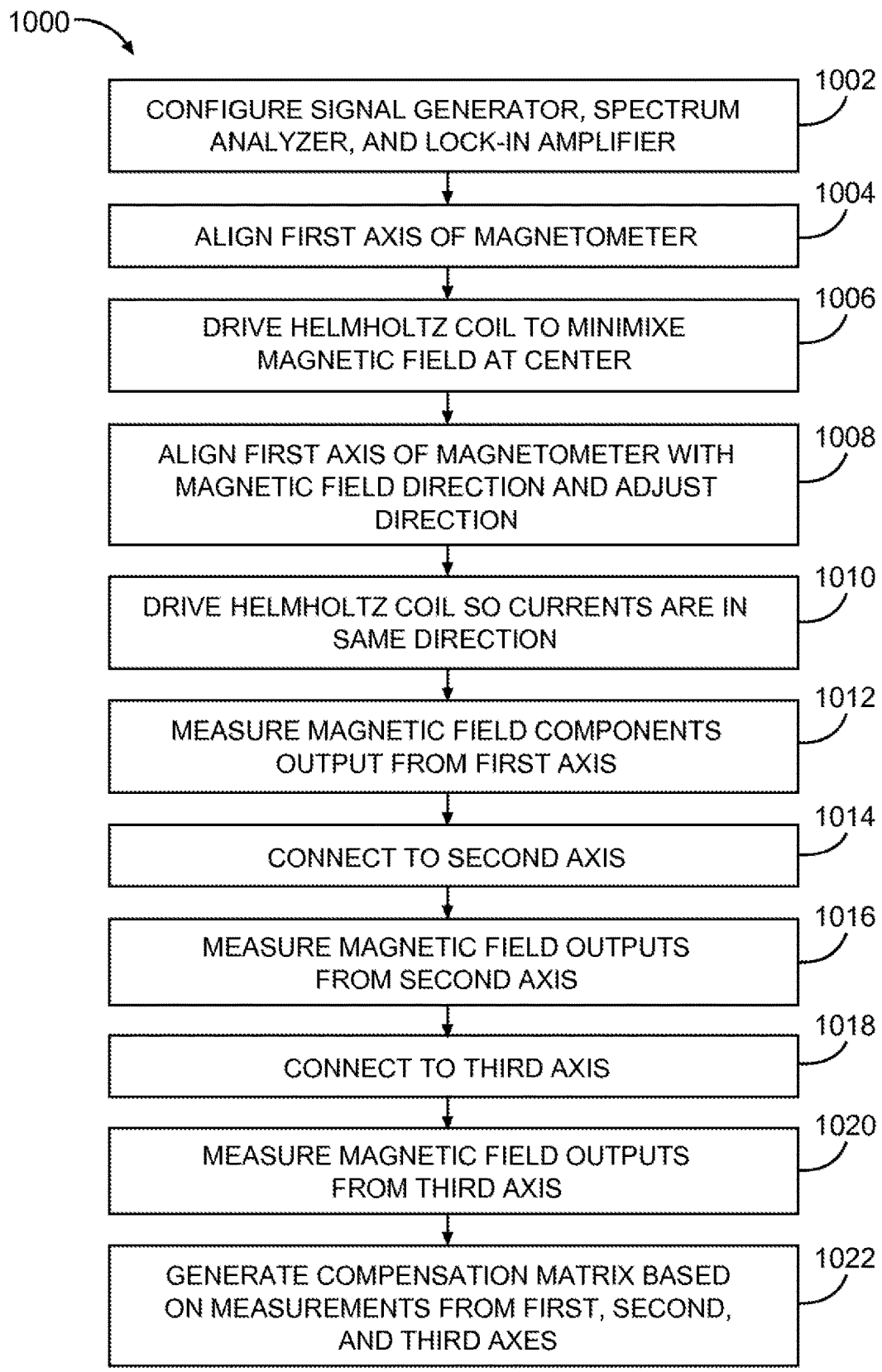
FIG. 10 is a flowchart of an example method for calibrating sensitivity and orthogonality of a magnetometer in accordance with some embodiments.

FIG. 9 illustrates a system 900 for calibrating sensitivity and orthogonality of a magnetometer in accordance with some embodiments and FIG. 10 is a flowchart of an example method 1000 that uses system 900 for calibrating sensitivity and orthogonality of a magnetometer in accordance with some embodiments.

Referring to FIG. 9, the example 1D Helmholtz coil 901 has a radius and a number of turns of windings. The 1D Helmholtz coil 901 has a first coil 902 and a second coil 904. The triaxial magnetometer 906 to be calibrated to remove sensitivity and misalignment errors will be placed between the two coils 902 and 904 according to a placement as described earlier herein with reference to FIGS. 1-3 and Equations (1)-(2). The triaxial magnetometer 906 is placed at the center of the Helmholtz coil with axes X, Y and Z being aligned to a central axis C (FIG. 1) of the Helmholtz coil, respectively one at a time as will be described in more detail later herein and as was described above with reference to FIGS. 8A-8C. In some examples, the radius of the 1D Helmholtz coil 901 can be about 5.95 inches, and there may be 200 turns of windings, however, these are example dimensions and example embodiments are not limited thereto.

The system 900 includes a spectrum analyzer 908, a lock-in amplifier 910, and a signal generator 912. In some embodiments, the signal generator 912 can include an Agilent 33220A function generator, available from Agilent Technologies of Santa Clara, Calif. The spectrum analyzer 908 can include a HP35670A spectrum analyzer available from Hewlett-Packard Co. of Palo Alto, Calif. The lock-in amplifier 910 can include an SR850 Lock-In Amplifier available from Stanford Research Systems of Sunnyvale, Calif.

The signal generator 912, spectrum analyzer 908, and lock-in amplifier can connect to computing system(s) 918, so that the computing system 918 can receive measurements for use in performing any calculations according to Equations (1)-(9) and Tables 1-3. In various embodiments, the computing system 918 can include a non-transitory machine-readable storage device comprising instructions stored thereon, which, when performed by the computing system 918, cause the computing system 918 to perform operations, the operations comprising one or more features similar to or identical to features of methods and techniques described herein.

A machine-readable storage device, herein, is a physical device that stores data represented by physical structure within the device. Examples of machine-readable storage devices can include, but are not limited to, memory in the form of read only memory (ROM), random access memory (RAM), a magnetic disk storage device, an optical storage device, a flash memory, and other electronic, magnetic, or optical memory devices, including combinations thereof. Executing these physical structures can cause the computing system 918 to perform operations of methods described herein.

Example method 1000 begins with operation 1002 by configuring the spectrum analyzer 908, the lock-in amplifier 910, and the signal generator 912. The output resistance of the signal generator 912 can be set to a high impedance, and the output of the signal generator 912 will drive the Helmholtz coil 901 with a sinusoidal signal at a frequency of, for example, 5 Hz, and an amplitude 1.378 $V_{pp}$. At these example signal generator 912 parameters, the Helmholtz coil 901 will generate a sinusoidal magnetic field of amplitude 0.099987 gauss; however embodiments are not limited to any particular input signal parameters.

The spectrum analyzer 908 can be configured for a number of input channels. Operators can select various parameters and settings for the spectrum analyzer. Some example settings include DC coupling, start frequency 0 Hz, stop frequency 12.5 Hz, and operation mode power-spectrum.

The lock-in amplifier 910 can be configured with a variety of parameters and with different traces configured. For example, the lock-in amplifier 910 can be configured to include an external CLK reference, gain 50 mV RMS, with a first trace for the magnitude of the signal vector (R). A second trace can be used to trace the phase difference (θ) between the signal and the reference, with sync filtering on.

The example method 1000 continues with operation 1004 by aligning the X-axis of the magnetometer towards the direction of the magnetic field as shown by the arrow 914 of FIG. 9. In operation 1006, the switch 916 is then switched to the top position as shown so that the currents flowing in the two coils 902 and 904 are opposite to each other. This will minimize the magnetic field at the center of the Helmholtz coil 901.

In operation 1008, the magnetometer 906 is placed at the center of the Helmholtz coil 901 with the positive direction of the X-axis of the magnetometer being in the same direction of the magnetic field as shown by arrow 914. Next, the output of the magnetometer 906 X-axis is coupled to the A-channel input of the lock-in amplifier 910. Subsequently, the position of the magnetometer 906 is adjusted such that the amplitude of magnetometer 906 X-axis reaches minimum based on examination of the R-reading of the lock-in amplifier 910. A lock screw (not shown in FIG. 9) can be adjusted on the mounting fixture (not shown in FIG. 9) to fix the magnetometer 906 at the center of the Helmholtz coil 901.

In operation 1010, the switch 916 is switched to the bottom position so that the currents flowing in the two coils 902, 904 are in the same direction. In operation 1012, the output of the X-axis of the magnetometer 906 is connected to the input of the spectrum analyzer 908 A-channel the Y-axis is connected to the B-channel, and the Z-axis is connected to the C-channel to measure the absolute values of the readings of the A, B and C channels to capture $BXm_x$, $BXm_y$, and $BXm_z$, respectively.

In operation 1014, the output of the Y-axis of the magnetometer 906 is connected to the A-channel of the lock-in amplifier 910 to read the θ value. If θ is near 180 degrees, then $BXm_y$ is a negative value, and a minus sign is placed before $BXm_y$ for use in later calculations. Similarly, the output of the Z-axis of the magnetometer 906 is connected to the A-channel of the lock-in amplifier 910 to read the θ value, and if θ is near 180 degrees, then $BXm_z$ is a negative value and a minus sign is used for $BXm_z$.

In operation 1016, operations 1008 and at least some of operations 1010 are repeated for the Y-axis of the magnetometer 906. Subsequently, the output of the X-axis of the magnetometer 906 is coupled to the input of the spectrum analyzer 908 A-channel, the Y-axis is coupled to the B-channel, and the Z-axis is coupled to the C-channel. The absolute values of the readings of the A, B and C channels are examined and recorded as $BYm_x$, $BYm_y$ and $BYm_z$ respectively.

The output of the X-axis of the magnetometer 906 is coupled to the A-channel of the lock-in amplifier 910 to capture the θ value. If θ is near 180 degrees, then $BYm_x$ is a negative value, and a minus sign is placed before $BYm_x$. Similarly, the output of the Z-axis of the magnetometer 906 is coupled to the A-channel of the lock-in amplifier 910 to read the θ value. If θ is near 180 degrees, then $BYm_z$ is a negative value, and a minus sign is placed before $BYm_z$.

In operation 1018, operations 1008 and at least some of operations 1010 are repeated for the Z-axis of the magnetometer 906. In operation 1020, the output of the X-axis of magnetometer 906 is coupled to the input of the spectrum analyzer 908 A-channel, the Y-axis is coupled to the B-channel, and the Z-axis is coupled the C-channel to read the values of the readings of the A, B and C channels, and recorded as $BZm_x$, $BZm_y$ and $BZm_z$, respectively. The output of the X-axis of the magnetometer 906 is connected to the A-channel of the Lock-In amplifier to read the θ value. If θ is near 180 degrees, then $BZm_x$ is a negative value and a minus sign is placed before $BZm_x$. Similarly, the output of the Y-axis of the magnetometer 906 is connected to the A-channel of the lock-in amplifier 910 to read the θ value. If θ is near 180 degrees, then $BZm_y$ is a negative value, and a minus sign is placed before $BZm_y$.

Having captured the elements of the projection matrix according to Equation (4), the example method 1000 continues with operation 1022, wherein the computing system 918 uses the projection matrix to calculate the sensitivity and the misalignment according to Table 1, to calculate the compensation matrix Equation (8). When the magnetometer is then used downhole, the processing unit 1120 (FIG. 11) will use the compensation matrix to correct sensitivity and misalignment errors according to Equation (9) as described earlier herein with reference to Tables 2 and 3 and the corresponding discussion thereof.

Figure 11:
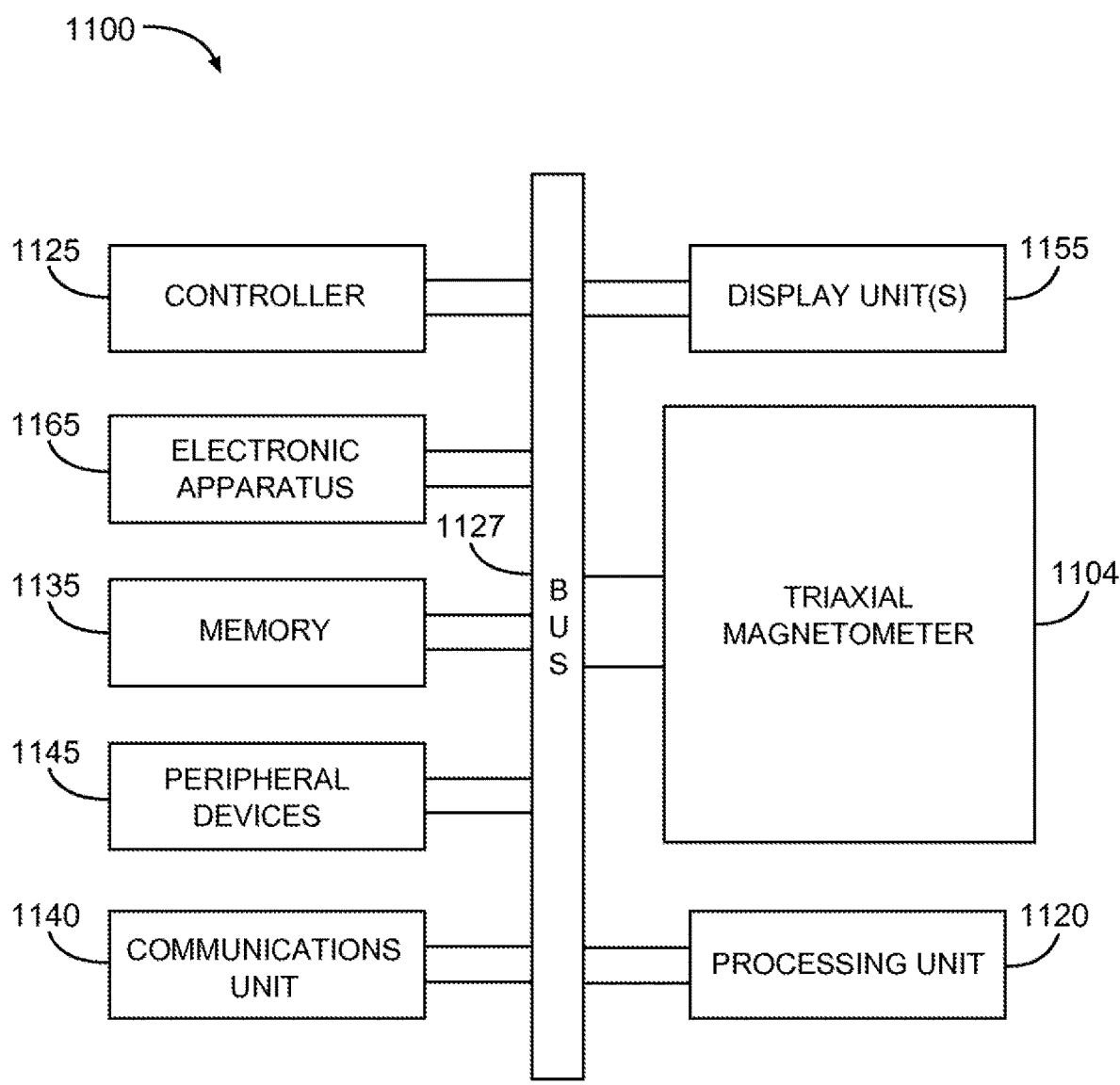
FIG. 11 is a block diagram of a system in accordance with some embodiments.

FIG. 11 depicts a block diagram of features of a logging system 1100 in accordance with various embodiments. The logging system 1100 includes a magnetometer 1104, for example a triaxial magnetometer that has been calibrated as described above, and for which a compensation matrix has been generated according to methods described earlier herein. The processing unit 1120 can couple to the magnetometer 1104 to obtain measurements from the magnetometer 1104. The processing unit 1120 can use the compensation matrix to adjust measurements received from a magnetometer 1104 after the magnetometer 1104 is placed downhole.

The logging system 1100 can additionally include a controller 1125, a memory 1135, an electronic apparatus 1165, and a communications unit 1140. The controller 1125 and the memory 1135 can be fabricated to operate the magnetometer 1104 to acquire measurement data as the magnetometer 1104 is operated.

Electronic apparatus 1165 can be used in conjunction with the controller 1125 to perform tasks associated with taking measurements downhole with the magnetometer 1104. The communications unit 1140 can include downhole communications in a drilling operation. Such downhole communications can include a telemetry system.

The logging system 1100 can also include a bus 1127, where the bus 1127 provides electrical conductivity among the components of the logging system 1100. The bus 1127 can include an address bus, a data bus, and a control bus, each independently configured. The bus 1127 can also use common conductive lines for providing one or more of address, data, or control, the use of which can be regulated by the controller 1125. The bus 1127 can include instrumentality for a communication network. The bus 1127 can be configured such that the components of the logging system 1100 are distributed. Such distribution can be arranged between downhole components such as the magnetometer 1104 and components that can be disposed on the surface of a well. Alternatively, various of these components can be co-located such as on one or more collars of a drill string or on a wireline structure.

In various embodiments, the logging system 1100 includes peripheral devices that can include displays 1155, additional storage memory, or other control devices that may operate in conjunction with the controller 1125 or the memory 1135.

In an embodiment, the controller 1125 can be realized as one or more processors. The display 1155 can be arranged to operate with instructions stored in the memory 1135 to implement a user interface to manage the operation of the magnetometer 1104 or components distributed within the logging system 1100. Such a user interface can be operated in conjunction with the communications unit 1140 and the bus 1127. Various components of the logging system 1100 can be integrated with the magnetometer 1104 or associated housing to receive measurements from a calibrated magnetometer, calibrated according to methods described earlier herein, after the calibrated magnetometer 1104 has been placed downhole.

In various embodiments, a non-transitory machine-readable storage device can comprise instructions stored thereon, which, when performed by a machine, cause the machine to perform operations, the operations comprising one or more features similar to or identical to features of methods and techniques described herein. A machine-readable storage device, herein, is a physical device that stores data represented by physical structure within the device. Examples of machine-readable storage devices can include, but are not limited to, memory 1135 in the form of read only memory (ROM), random access memory (RAM), a magnetic disk storage device, an optical storage device, a flash memory, and other electronic, magnetic, or optical memory devices, including combinations thereof. The physical structure of such instructions may be operated on by one or more processors such as, for example, the processing unit 1120. Executing these physical structures can cause the machine to perform operations as described above.

In the case of ranging applications, an oscillating magnetic field can be induced in a target that is to be located. This can be achieved with a rotating magnet on a drill bit, for example, or using an electromagnetic source, such as a transmitter. Alternating current can also be impressed on the casing of a target well, or the source of a time-varying magnetic field can be placed in the target well.

Figure 12:
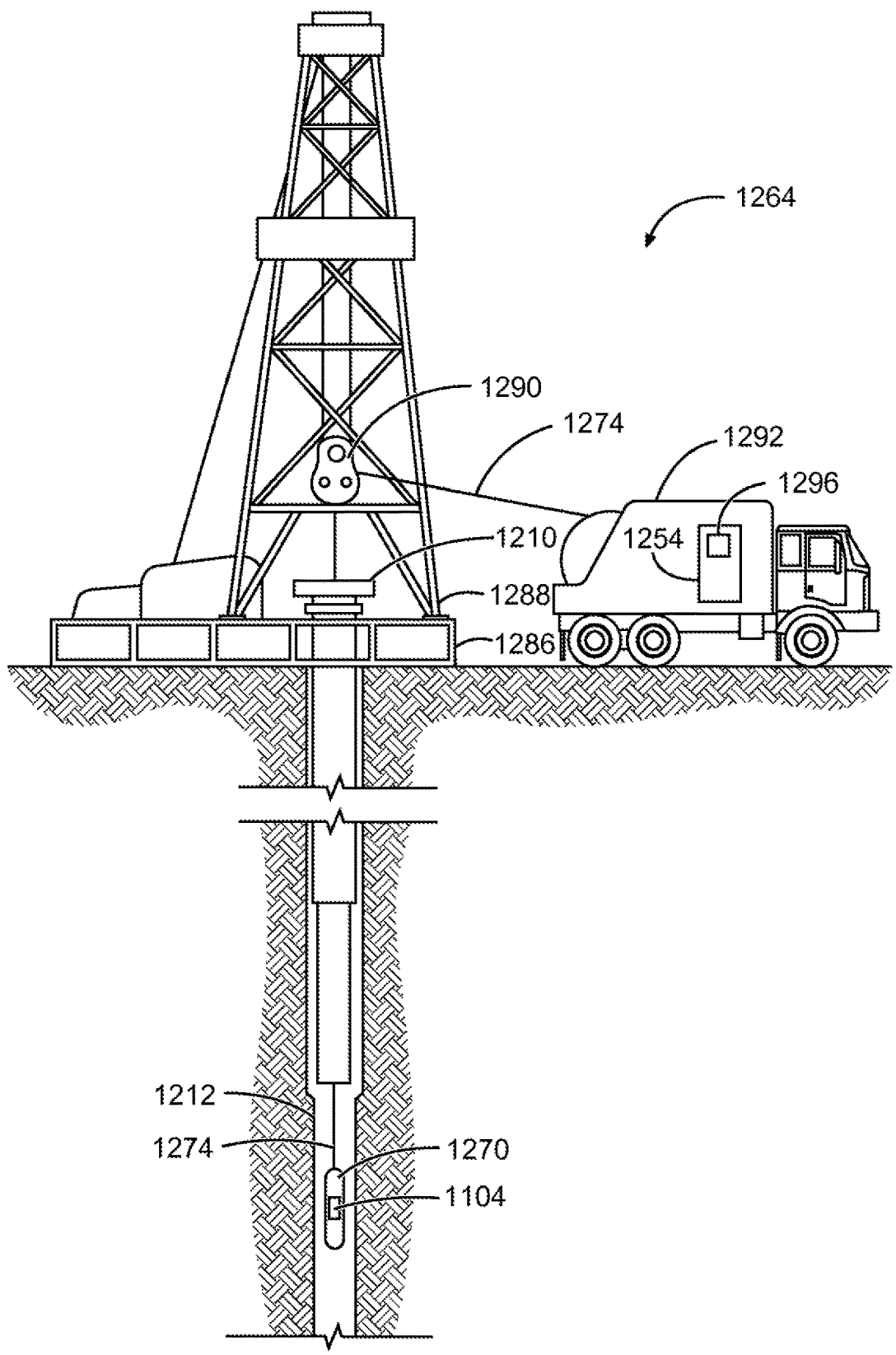
FIG. 12 illustrates a wireline system embodiment of the invention.
Figure 13:
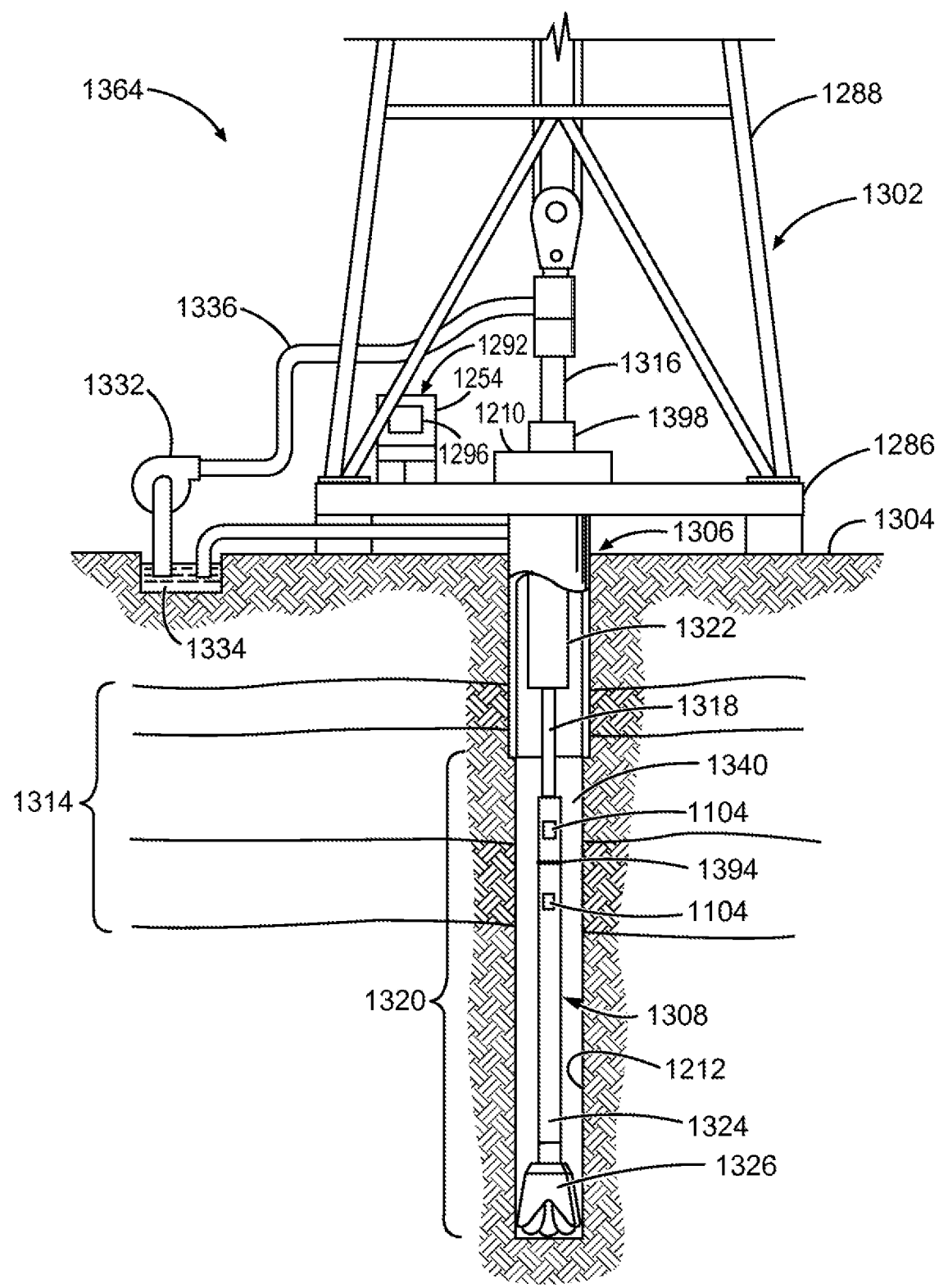
FIG. 13 illustrates a drilling rig system embodiment of the invention.

FIG. 12 illustrates a wireline system 1264 embodiment of the invention, and FIG. 13 illustrates a drilling rig system 864 embodiment of the invention. Thus, the systems 1264, 1364 may comprise portions of a wireline logging tool body 1270 as part of a wireline logging operation, or of a downhole tool 1324 as part of a downhole drilling operation. Thus, FIG. 12 shows a well during wireline logging operations. In this case, a drilling platform 1286 is equipped with a derrick 1288 that supports a hoist 1290.

Drilling oil and gas wells is commonly carried out using a string of drill pipes connected together so as to form a drilling string that is lowered through a rotary table 1210 into a well bore or borehole 1212. Here it is assumed that the drilling string has been temporarily removed from the borehole 1212 to allow a wireline logging tool body 1270, such as a probe or sonde, to be lowered by wireline or logging cable 1274 into the borehole 1212. Typically, the wireline logging tool body 1270 is lowered to the bottom of the region of interest and subsequently pulled upward at a substantially constant speed.

During the upward trip, at a series of depths the instruments (e.g., the magnetometer 1104 shown in FIG. 11) included in the tool body 1270 may be used to perform measurements on the subsurface geological formations adjacent the borehole 1212 (and the tool body 1270). The measurement data can be communicated to a surface logging facility 1292 for storage, processing, and analysis. The logging facility 1292 may be provided with electronic equipment for various types of signal processing, which may be implemented by any one or more of the components of the magnetometer 1104. Similar formation evaluation data may be gathered and analyzed during drilling operations (e.g., during LWD operations, and by extension, sampling while drilling).

In some embodiments, the tool body 1270 comprises a magnetic tool for obtaining and analyzing magnetic field measurements in a subterranean formation through a borehole 1212. The tool is suspended in the wellbore by a wireline cable 1274 that connects the tool to a surface control unit (e.g., comprising a workstation 1254). The tool may be deployed in the borehole 1212 on coiled tubing, jointed drill pipe, hard wired drill pipe, or any other suitable deployment technique.

Turning now to FIG. 13, it can be seen how a system 1364 may also form a portion of a drilling rig 1302 located at the surface 1304 of a well 1306. The drilling rig 1302 may provide support for a drill string 1308. The drill string 1308 may operate to penetrate the rotary table 1210 for drilling the borehole 1212 through the subsurface formations 1314. The drill string 1308 may include a Kelly 1316, drill pipe 1318, and a bottom hole assembly 1320, perhaps located at the lower portion of the drill pipe 1318.

The bottom hole assembly 1320 may include drill collars 1322, a downhole tool 1324, and a drill bit 1326. The drill bit 1326 may operate to create the borehole 1212 by penetrating the surface 1304 and the subsurface formations 1314. The downhole tool 1324 may comprise any of a number of different types of tools including MWD tools, LWD tools, and others.

During drilling operations, the drill string 1308 (perhaps including the Kelly 1316, the drill pipe 1318, and the bottom hole assembly 1320) may be rotated by the rotary table 1210. Although not shown, in addition to, or alternatively, the bottom hole assembly 1320 may also be rotated by a motor (e.g., a mud motor) that is located downhole. The drill collars 1322 may be used to add weight to the drill bit 1326. The drill collars 1322 may also operate to stiffen the bottom hole assembly 1320, allowing the bottom hole assembly 1320 to transfer the added weight to the drill bit 1326, and in turn, to assist the drill bit 1326 in penetrating the surface 1304 and subsurface formations 1314.

During drilling operations, a mud pump 1332 may pump drilling fluid (sometimes known by those of ordinary skill in the art as "drilling mud") from a mud pit 1334 through a hose 1336 into the drill pipe 1318 and down to the drill bit 1326. The drilling fluid can flow out from the drill bit 1326 and be returned to the surface 1304 through an annular area 1340 between the drill pipe 1318 and the sides of the borehole 1212. The drilling fluid may then be returned to the mud pit 1334, where such fluid is filtered. In some embodiments, the drilling fluid can be used to cool the drill bit 1326, as well as to provide lubrication for the drill bit 1326 during drilling operations. Additionally, the drilling fluid may be used to remove subsurface formation cuttings created by operating the drill bit 1326.

Thus, it may be seen that in some embodiments, the systems 1264, 1364 may include a drill collar 1322, a downhole tool 1324, and/or a wireline logging tool body 1270 to house one or more magnetometers 1104, similar to or identical to the magnetometer 1104 described above with reference to the logging system 1100. Components of the system 1100 in FIG. 11 may also be housed by the tool 1324 or the tool body 1270.

Thus, for the purposes of this document, the term "housing" may include any one or more of a drill collar 1322, a downhole tool 1324, or a wireline logging tool body 1270 (all having an outer wall, to enclose or attach to magnetometers, sensors, fluid sampling devices, pressure measurement devices, transmitters, receivers, acquisition and processing logic, and data acquisition systems). The tool 1324 may comprise a downhole tool, such as an LWD tool or MWD tool. The wireline tool body 1270 may comprise a wireline logging tool, including a probe or sonde, for example, coupled to a logging cable 1274. Many embodiments may thus be realized.

Thus, a system 1264, 1364 may comprise a downhole tool body, such as a wireline logging tool body 1270 or a downhole tool 1324 (e.g., an LWD or MWD tool body), and one or more magnetometers 1104 attached to the tool body, the magnetometer 1104 to be constructed and operated as described previously.

Any of the above components, for example the magnetometers 1104, processing units 1120, etc., may all be characterized as "modules" herein. Such modules may include hardware circuitry, and/or a processor and/or memory circuits, software program modules and objects, and/or firmware, and combinations thereof, as desired by the architect of the magnetometer 1104 and systems 1100, 1264, 1364 and as appropriate for particular implementations of various embodiments. For example, in some embodiments, such modules may be included in an apparatus and/or system operation simulation package, such as a software electrical signal simulation package, a power usage and distribution simulation package, a power/heat dissipation simulation package, and/or a combination of software and hardware used to simulate the operation of various potential embodiments.

It should also be understood that the apparatus and systems of various embodiments can be used in applications other than for logging operations, and thus, various embodiments are not to be so limited. The illustrations of magnetometer 1104 and systems 1100, 1264, 1364 are intended to provide a general understanding of the structure of various embodiments, and they are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, processor modules, embedded processors, data switches, and application-specific modules. Some embodiments include a number of methods.

It should be noted that the methods described herein do not have to be executed in the order described, or in any particular order. Moreover, various activities described with respect to the methods identified herein can be executed in iterative, serial, or parallel fashion. Information, including parameters, commands, operands, and other data, can be sent and received in the form of one or more carrier waves.

Upon reading and comprehending the content of this disclosure, one of ordinary skill in the art will understand the manner in which a software program can be launched from a non-transitory computer-readable medium in a computer-based system to execute the functions defined in the software program. One of ordinary skill in the art will further understand the various programming languages that may be employed to create one or more software programs designed to implement and perform the methods disclosed herein. For example, the programs may be structured in an object-orientated format using an object-oriented language such as Java or C #. In another example, the programs can be structured in a procedure-orientated format using a procedural language, such as assembly or C. The software components may communicate using any of a number of mechanisms well known to those skilled in the art, such as application program interfaces or interprocess communication techniques, including remote procedure calls. The teachings of various embodiments are not limited to any particular programming language or environment. Thus, other embodiments may be realized.

In summary, using the apparatus, systems, and methods disclosed herein may provide increased magnetic field measurement sensitivity over a wider range of temperatures relative to conventional mechanisms. As a result, the depth, range, and/or data rate of electromagnetic telemetry systems may be extended, as may the range at which magnetic bodies and oscillating electromagnetic sources can be sensed remotely. A combination of these advantages can significantly enhance the value of the services provided by an operation/exploration company, while at the same time controlling time-related costs.

Further examples of apparatuses, methods, a means of performing acts, systems or devices include, but are not limited to:

Example 1 is a method comprising operations wherein any apparatuses or devices described herein can include means for performing the method of Example 1, and wherein the method of Example 1 comprises positioning a calibrated magnetometer within a mounting fixture between two coils of a Helmholtz coil, the two coils arranged in mutually parallel planes and being separated by a distance equal to an estimated radius of the Helmholtz coil, the mounting fixture being mounted such that a position of the mounting fixture is adjustable to a plurality of positions along a center axis of the Helmholtz coil that is orthogonal to the mutually parallel planes; adjusting the position of the mounting fixture between the two coils over at least a subset of the plurality of positions; providing an excitation signal to the Helmholtz coil, subsequent to adjusting the position of the mounting fixture to each of the plurality of positions, to generate a magnetic field at the calibrated magnetometer; measuring the magnetic field using the calibrated magnetometer to generate a first set of magnetic field measurements associated with the plurality of positions; and adjusting the distance between the two coils based on the first set of magnetic field measurements.

Example 2 includes the subject matter of Example 1, and further optionally including wherein adjusting the distance comprises generating a value for a separation distance between the two coils according to a mathematical relationship between the first set of magnetic field measurements, a radius of the Helmholtz coil, and the separation distance between the two coils; and adjusting the distance between the two coils to correspond to a true radius of the Helmholtz coil obtained through a data fitting algorithm.

Example 3 includes the subject matter of any of Examples 1-2, and further optionally comprising adjusting the position of the mounting fixture subsequent to having adjusting the distance between the two coils based on the first set of magnetic field measurements.

Example 4 includes the subject matter of Example 3, and further optionally wherein adjusting the position of the mounting fixture comprises moving the position of the mounting fixture through a plurality of positions; measuring the magnetic field, using the calibrated magnetometer mounted inside the mounting fixture, at each of a plurality of positions to generate a second set of magnetic field measurements associated with the plurality of positions; and adjusting the position of the mounting fixture according to a center location of the Helmholtz coil, the center location having been calculated using a mathematical relationship based on the second set of magnetic field measurements.

Example 5 includes the subject matter of any of Examples 1-4 and optionally including positioning a triaxial magnetometer to be calibrated inside the mounting fixture, subsequent to calibrating the position of the mounting fixture, the mounting fixture having an aperture configured to align the X-axis, the Y-axis, and the Z-axis of a triaxial magnetometer to the axis of the Helmholtz coil, respectively one axis at a time, when the triaxial magnetometer is inserted in the mounting fixture; using the Helmholtz coil to apply magnetic field to each axis of the triaxial magnetometer, one axis at a time, to generate a third set of magnetic field measurements; and generating a compensation matrix that contains data representative of misalignment errors based on the third set of magnetic field measurements.

Example 6 includes the subject matter of Example 5, and optionally further includes wherein applying the magnetic field to the triaxial magnetometer includes applying the magnetic field to the X-axis of the triaxial magnetometer and recording the magnetic field measured by the X, Y and Z axes of the triaxial magnetometer; applying the magnetic field to the Y-axis of the triaxial magnetometer and subsequently recording the magnetic field measured by the X, Y and Z axes of the triaxial magnetometer; and applying the magnetic field to the Z-axis of the triaxial magnetometer, and subsequently recording the magnetic field measured by the X, Y and Z axes of the triaxial magnetometer.

Example 7 includes the subject matter of Example 6, and optionally further includes wherein the magnetic field is applied along the X-axis, Y-axis, and the Z-axis by rotating the triaxial magnetometer between each application of the magnetic field.

Example 8 includes the subject matter of Example 7, and optionally further includes calculating the measured magnetic field based on the compensation matrix.

Example 9 is a device (e.g., a Helmholtz coil or fixture or portion thereof) or other apparatus as can implement methods of Examples 1-8, or upon which Examples 1-8 can be implemented, comprising a Helmholtz coil including a first coil and a second coil arranged in mutually parallel planes and spaced a distance from each other along an axis orthogonal to the parallel planes, the first coil and the second coil slidably engaged with a first rail and a second rail such that the first coil and the second coil move along the first rail and the second rail to adjust the distance; and a mounting fixture including an aperture for mounting a magnetometer, the mounting fixture being slidably mounted to a third rail, the third rail passing through the first coil and through the second coil parallel to the axis such that the mounting fixture moves along the third rail to adjust a distance between the mounting fixture and each of the first coil and the second coil.

Example 10 includes subject matter of Example 9, and further optionally comprising wherein the aperture is shaped such that a magnetometer inserted into the aperture is rotationally adjustable to rotate about an origin of the mounting fixture.

Example 11 includes a system or portions of a system, which can include subject matter of Examples 9-10 or means for implementing Examples 1-8, including a one-dimensional (1D) Helmholtz coil including a first coil and a second coil arranged in mutually parallel planes and spaced a distance from each other along an axis orthogonal to the parallel planes, the first coil and the second coil slidably engaged with a first rail and a second rail such that the first coil and the second coil slidably move along the first rail and the second rail to adjust the distance; and a mounting fixture including an aperture for mounting a magnetometer, the mounting fixture being slidably mounted to a third rail, the third rail passing through the first coil and through the second coil parallel to the axis such that the mounting fixture slidably moves along the third rail to adjust a distance between the mounting fixture and each of the first coil and the second coil; and a magnetometer, inserted into the aperture, to provide magnetic field measurements; and a signal generator to providing a driving signal to the 1D Helmholtz coil.

Example 12 includes the subject matter of Example 11, and optionally including one or more processors to process magnetic field measurements of the calibrated magnetometer, and memory to store the magnetic field measurements.

Example 13 includes the subject matter of any of Examples 10-11, and optionally further including a spectrum analyzer to analyze and display data representative of magnetic field measurements.

Example 14 includes the subject matter of any of Examples 10-13, and optionally further including a triaxial magnetometer to mount inside the mounting fixture; and a lock-in amplifier to couple to the triaxial magnetometer to receive measurement signals from the triaxial magnetometer through at least a portion of a calibration procedure.

Example 15 includes a medium or article of manufacture upon which is stored instructions that, when implemented on a machine, cause the machine to perform operations including receiving a first set of magnetic field measurements that have been generated by a one-dimensional Helmholtz coil having two coils with a radius, the two coils being spaced from each other by the radius of the Helmholtz coil; and generating a calculated value for a separation distance by which the two coils are to be separated based on a relationship between the first set of magnetic field measurements, the radius, and the separation distance.

Example 16 includes the subject matter of claim 15 and optionally including wherein the relationship between the first set of magnetic field measurements, the radius, and the separation distance includes a mathematical relationship defined according to $$B(x, s) = \frac{\varpi 0 I N R^2}{2} \left[ (R^2 + x^2)^{\frac{-3}{2}} + \lceil R^2 + (s-x)^2 \rceil^{\frac{-3}{2}} \right]$$

where B(x, s) is the received magnetic field measurement at a point x, s is the separation distance, R is the radius of each of the two coils, I represents a value for electrical current in the Helmholtz coil, N is the number of turns on each of the two coils, and $\mu_0$ is the permeability of free space.

Example 17 includes the subject matter of any of Examples 15-16 and optionally including instructions, that, when implemented on the machine, cause the machine to generate a best fit curve based on the first set of magnetic field measurements; and determine the calculated value for the distance based on the best fit curve.

Example 18 includes the subject matter of any of Examples 15-17, and including optional further instructions to cause the machine to provide the calculated value for the distance to a display.

Example 19 includes the subject matter of any of Examples 15-18, and including optional further instructions to cause the machine to receive a second set of magnetic field measurements from the Helmholtz coil, the separation distance between the two coils having been adjusted to equal the calculated value for the separation distance; and generate a calculated value for a center of the Helmholtz coil based on a relationship between the second set of magnetic field measurements, the radius, and the separation distance.

Example 20 includes the subject matter of any of Examples 15-19 and optionally wherein the relationship between the second set of magnetic field measurements, the radius, and the separation distance includes a mathematical relationship defined according to $$B(x, s) = \frac{\mu_0 INR^2}{2}\left[[R^2 + (x_0 + k\Delta x)^2]^{-\frac{3}{2}} + [R^2 + [R - (x_0 + k\Delta x)]^2]^{-\frac{3}{2}}\right]$$

where B(x,s) is the received magnetic field measurement at a point x, s is the separation distance, R is the radius of each of the two coils, I is electrical current in the Helmholtz coil, N is the number of turns on each of the two coils, $\mu_0$ is the permeability of free space, $x_0$ is the offset of a first coil of the two coils from the center of the Helmholtz coil, $\Delta x$ is a length, and k is an integer.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

Although specific embodiments have been illustrated and described herein, it will be appreciated by those of ordinary skill in the art that any arrangement that is calculated to achieve the same purpose may be substituted for the specific embodiments shown. Various embodiments use permutations or combinations of embodiments described herein. It is to be understood that the above description is intended to be illustrative, and not restrictive, and that the phraseology or terminology employed herein is for the purpose of description. Combinations of the above embodiments and other embodiments will be apparent to those of ordinary skill in the art upon studying the above description.

What is claimed is:

1. A method comprising:

positioning a calibrated magnetometer within a mounting fixture between two coils of a Helmholtz coil, the two coils arranged in mutually parallel planes and being separated by a distance equal to an estimated radius of the Helmholtz coil, the mounting fixture being mounted such that a position of the mounting fixture is adjustable to a plurality of positions along a center axis of the Helmholtz coil that is orthogonal to the mutually parallel planes;

adjusting the position of the mounting fixture between the two coils over at least a subset of the plurality of positions;

providing an excitation signal to the Helmholtz coil, subsequent to adjusting the position of the mounting fixture to each of the plurality of positions, to generate a magnetic field at the calibrated magnetometer;

measuring the magnetic field using the calibrated magnetometer to generate a first set of magnetic field measurements associated with the plurality of positions;

adjusting the distance between the two coils based on the first set of magnetic field measurements;

rotating the calibrated magnetometer within the mounting fixture between the two coils of a Helmholtz coil such that an axis of the calibrated magnetometer is perpendicularly positioned relative to a position of the axis of the calibrated magnetometer prior to the rotating;

generating a value for a separation distance between the two coils according to a mathematical relationship between the first set of magnetic field measurements, a radius of the Helmholtz coil, and the separation distance between the two coils; and adjusting the distance between the two coils to correspond to a true radius of the Helmholtz coil obtained through a data fitting algorithm.

2. The method of claim 1, further comprising:

a further adjusting the position of the mounting fixture subsequent to having adjusting the distance between the two coils based on the first set of magnetic field measurements.

3. The method of claim 2, wherein the further adjusting the position of the mounting fixture comprises:

moving the position of the mounting fixture through the plurality of positions;

measuring the magnetic field, using the calibrated magnetometer mounted inside the mounting fixture, at each of the plurality of positions to generate a second set of magnetic field measurements associated with the plurality of positions; and adjusting the position of the mounting fixture according to a center location of the Helmholtz coil, the center location having been calculated using a mathematical relationship based on the second set of magnetic field measurements, thereby calibrating the position of the mounting fixture.

4. The method of claim 3, further comprising:

positioning a triaxial magnetometer to be calibrated inside the mounting fixture, subsequent to the calibrating the position of the mounting fixture, the mounting fixture having an aperture configured to align an X-axis, a Y-axis, and a Z-axis of the triaxial magnetometer to the axis of the Helmholtz coil, respectively one axis at a time, when the triaxial magnetometer is inserted in the mounting fixture;

using the Helmholtz coil to apply the magnetic field to each axis of the triaxial magnetometer, one axis at a time, to generate a third set of magnetic field measurements; and generating a compensation matrix that contains data representative of misalignment errors based on the third set of magnetic field measurements.

5. The method of claim 4, wherein applying the magnetic field to the triaxial magnetometer includes:
- applying the magnetic field to the X-axis of the triaxial magnetometer and recording the magnetic field measured by the X, Y and Z axes of the triaxial magnetometer;
- applying the magnetic field to the Y-axis of the triaxial magnetometer and subsequently recording the magnetic field measured by the X, Y and Z axes of the triaxial magnetometer; and
- applying the magnetic field to the Z-axis of the triaxial magnetometer, and subsequently recording the magnetic field measured by the X, Y and Z axes of the triaxial magnetometer.

6. The method of claim 5, wherein the magnetic field is applied along the X-axis, Y-axis, and the Z-axis by rotating the triaxial magnetometer between each application of the magnetic field.

7. The method of claim 5, further comprising:
- calculating the measured magnetic field measured by the triaxial magnetometer based on the compensation matrix.

* * * * *